(12) United States Patent
Rastegar

(10) Patent No.: US 7,629,556 B2
(45) Date of Patent: Dec. 8, 2009

(54) LASER NOZZLE METHODS AND APPARATUS FOR SURFACE CLEANING

(75) Inventor: Abbas Rastegar, Schenectady, NY (US)

(73) Assignee: Sematech, Inc., Austin, TX (US)

( * ) Notice: Subject to any disclaimer, the term of this patent is extended or adjusted under 35 U.S.C. 154(b) by 132 days.

(21) Appl. No.: 11/532,700

(22) Filed: Sep. 18, 2006

(65) Prior Publication Data

US 2007/0163715 A1 Jul. 19, 2007

Related U.S. Application Data

(63) Continuation-in-part of application No. 11/305,312, filed on Dec. 16, 2005, now abandoned.

(51) Int. Cl.
*B23K 26/14* (2006.01)
*B08B 3/00* (2006.01)

(52) U.S. Cl. ...................... 219/121.84; 134/1

(58) Field of Classification Search ............ 134/1, 134/1.1; 219/121.84, 121.62, 121.68, 121.69, 219/121.75, 121.83; 315/111.21; 216/65, 216/66
See application file for complete search history.

(56) References Cited

U.S. PATENT DOCUMENTS

| 3,503,804 A * | 3/1970 | Schneider ............ 134/1 |
|---|---|---|
| 3,756,344 A * | 9/1973 | Daiber et al. ........... 73/432.1 |
| 4,179,599 A * | 12/1979 | Conrad ............. 219/121.6 |
| 5,023,424 A * | 6/1991 | Vaught ............ 219/121.68 |
| 5,135,608 A * | 8/1992 | Okutani ............ 438/584 |
| 5,198,634 A * | 3/1993 | Mattson et al. ........ 134/1.1 |
| 5,236,512 A * | 8/1993 | Rogers et al. ........ 134/1 |
| 5,328,555 A * | 7/1994 | Gupta ............ 134/1 |
| 5,459,771 A * | 10/1995 | Richardson et al. ....... 378/119 |
| 5,700,989 A * | 12/1997 | Dykhno et al. ........ 219/121.84 |
| 5,780,806 A * | 7/1998 | Ferguson et al. ........ 134/1 |
| 5,849,135 A * | 12/1998 | Selwyn ............ 134/1.1 |
| 5,866,870 A | 2/1999 | Walduck ............ 219/121.45 |
| 6,178,973 B1 | 1/2001 | Franca et al. ........ 134/1.3 |
| 6,214,160 B1 * | 4/2001 | Dornfest et al. ....... 156/345.28 |
| 6,627,846 B1 | 9/2003 | Yogev et al. .......... 219/121.85 |
| 6,635,845 B2 * | 10/2003 | Lee et al. ............ 219/121.68 |
| 6,777,642 B2 * | 8/2004 | Song et al. ........... 219/121.68 |
| 6,799,584 B2 * | 10/2004 | Yogev et al. ......... 134/1 |
| 6,827,816 B1 | 12/2004 | Uziel et al. ........... 156/345.39 |
| 6,908,567 B2 * | 6/2005 | Uziel ............. 216/65 |
| 2002/0096578 A1 * | 7/2002 | Al-Jiboory ............ 239/102.1 |
| 2003/0102294 A1 | 6/2003 | Kinbara et al. ....... 219/121.83 |
| 2004/0118823 A1 * | 6/2004 | Groen et al. .......... 219/121.69 |
| 2004/0224508 A1 | 11/2004 | Engel et al. .......... 138/689 |
| 2006/0213615 A1 * | 9/2006 | Rastegar ........... 156/345.5 |
| 2007/0131244 A1 * | 6/2007 | Allen ............. 134/1 |
| 2008/0257379 A1 * | 10/2008 | Buske et al. .......... 134/1.1 |

FOREIGN PATENT DOCUMENTS

| DE | 10133765 A1 * | 1/2003 |
|---|---|---|
| JP | 1-278983 | * 11/1989 |
| JP | 2002-343761 A | * 11/2002 |
| JP | 2003-303764 A | * 10/2003 |
| WO | WO-87/07862 A1 | * 12/1987 |

* cited by examiner

*Primary Examiner*—Geoffrey S Evans
(74) *Attorney, Agent, or Firm*—Fulbright & Jaworski, L.L.P.

(57) ABSTRACT

Apparatuses and methods for cleaning a surface comprising contaminate particles are provided. In one respect, plasma and/or a shockwave may be created in a fluid flowing through a nozzle. The nozzle, coupled to a laser source and a fluid feed may be configured to deliver the generated plasma and/or shockwave to the surface.

18 Claims, 7 Drawing Sheets

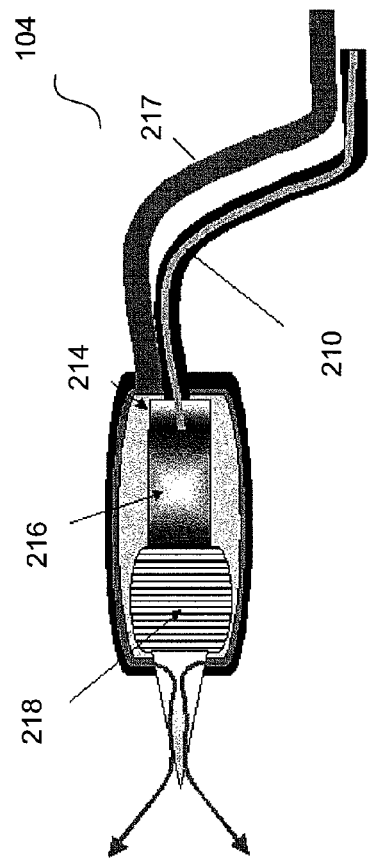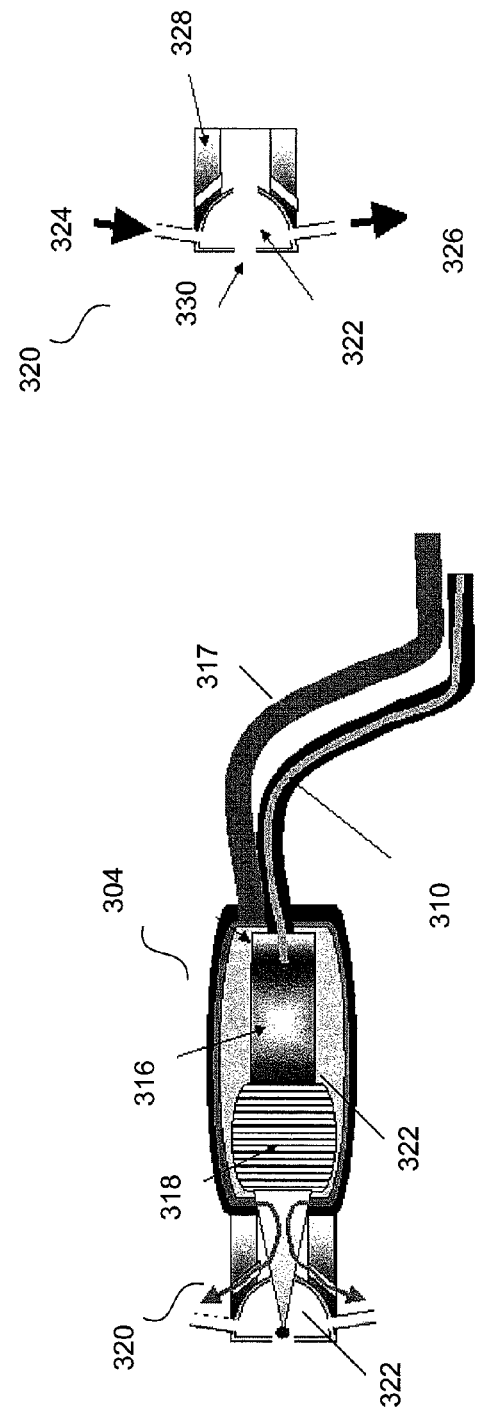

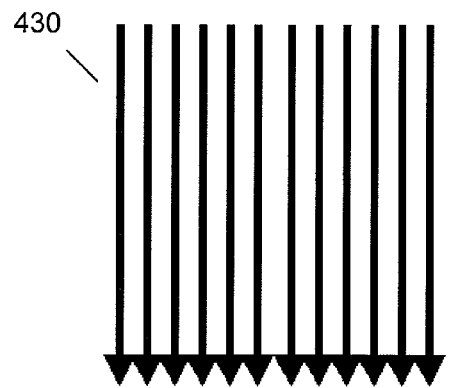 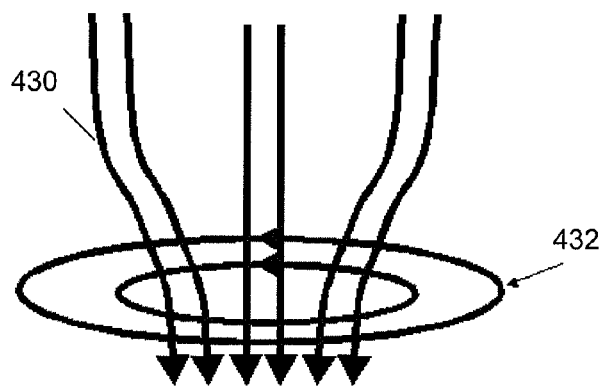
FIG. 4A            FIG. 4B
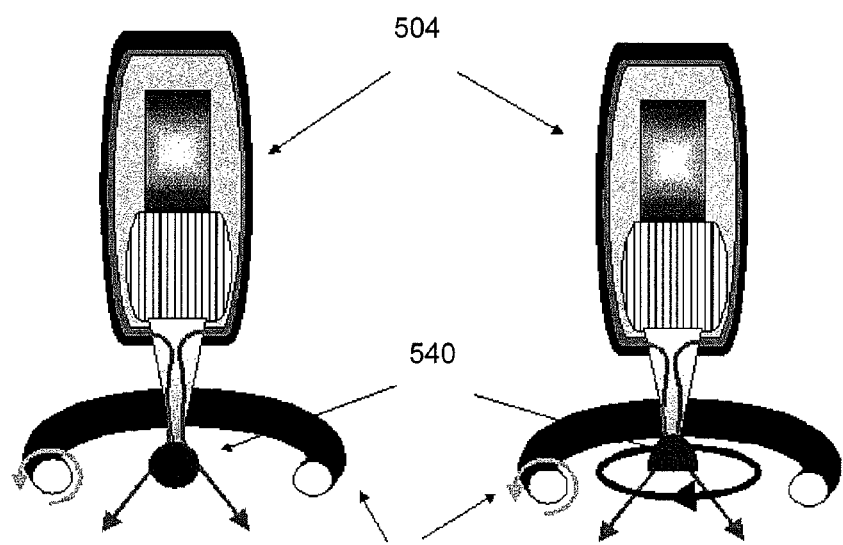
FIG. 5A            FIG. 5B

LASER NOZZLE METHODS AND APPARATUS FOR SURFACE CLEANING

This application is a continuation-in-part of U.S. application Ser. No. 11/305,312 filed Dec. 16, 2005 now abandoned. The entire text of the above-referenced disclosure is incorporated by reference herein without disclaimer.

BACKGROUND OF THE INVENTION

1. Field of the Invention

The present invention relates generally to semiconductor fabrication processes, and more particularly to an apparatus and method for removing particles from a surface.

2. Description of Related Art

Removal of sub-100 nanometer (nm) particles from a surface can be challenging for semiconductor fabrication processes. These particles may include contaminants on the surface including materials such as organic material, dust, residue, and/or metal impurities. Generally, the particles accumulate when a substrate is being stored or is in a stand-by state between successive processes and may cause defects, particularly for integrated circuits on a substrate.

The surface-particle interactions depend on the material and the surface structure. As such, the energy transfer efficiency needed to remove a particle from a surface strongly depends on the size of the particle on the surface. Generally, adhesive forces between the particle and the surface need to be broken and the particle needs to be transported far enough away from the surface such that the particle will not be redeposited on the surface.

Current methods for removing particles include wet cleaning techniques that involve immersing a substrate in a series of chemical solutions or spraying a series of chemical solutions onto a substrate, including for example, hydrofluoric acid, hydrogen peroxide solution, sulfuric acid, etc. In some techniques, a spin brush and/or a megasonic cleaner may be included. However, these processes are both expensive and produce waste that is environmentally harmful. Additionally, the use of a spin brush or an megasonic cleaner can be effective in removing large particles, but are hardly effective in removing particles on the order of submicrons or smaller.

Laser shockwave cleaning is another application using laser for surface cleaning. Particle removal efficiency depends on the momentum transferred to the particle on the surface, which in turn depends on the shock velocity parallel to the surface. The shock velocity depends on different parameters including the gas temperature and pressure. During the shock creation, plasma will form around the focus point of the laser light. However, when the focal point of the laser comes close to the surface, the plasma created can touch the surface and may cause damage to the surface.

Additionally, Next Generation Lithography (NGL) used in semiconductor technology includes reflective optics on glass substrates which have a surface roughness of approximately 1.5 Angstrom RMS or less to prevent scattering of the light, which may degrade the lithography process performance. Generally, all particles larger than about 27 nanometers need to be removed from the surface of a mask substrate that is used for NGL. The conventional wet cleaning techniques that use under etching of particles to remove particles from the surface are no longer applicable as they increase the surface roughness beyond the required value. In addition, most of the current advanced cleaning tools do not have the ability to remove the total particles with size of 27 nm and larger from the surface of the plates. This is due to the lack of a mechanism that is able to convey relatively high energy or momentum in distances of few nanometers from the surface. Further, current tools lack a mechanism to increase the population of reactive species in the vicinity of the interface. Most of the chemical reactions are driven by diffusion of the reactive species toward the surface.

The referenced shortcomings are not intended to be exhaustive, but rather are among many that tend to impair the effectiveness of previously known techniques concerning particle removal; however, those mentioned here are sufficient to demonstrate that the methodologies appearing in the art have not been satisfactory and that a significant need exists for the techniques described and claimed in this disclosure.

SUMMARY OF THE INVENTION

For sub 100 nm particles, physical techniques in addition to chemical techniques may be used to separate particles from a surface. Different laser cleaning techniques, such as using a laser interaction with the particle or a liquid-assisted laser cleaning technique may use sudden evaporation of a liquid (e.g., water) on the surface by laser pulses to remove particles from the surface. Further, the present disclosure provides parameters to control the energy transfer to the particle. For example, for the shockwave generation parameters, the droplet size and concentration (e.g., pressure), substrate surface temperature, chemical composition of the droplets may be controlled.

In one respect, an apparatus is provided. The apparatus may include a surface having contaminant particles thereon, a nozzle operably moveable to a location on the surface comprising the contaminant particles, and a fluid feed coupled to the nozzle for providing a fluid flow through the nozzle.

The apparatus may also include a light source coupled to the nozzle. The light source may provide a light to the fluid flow in the nozzle for generating plasma and a shockwave within the fluid flow. The generated plasma and shockwave may subsequently be provided to the surface by the nozzle for removing the contaminant particles.

In other respects, a method for removing particles on a surface is provided. The method may provide a light from a light source to a fluid flow through a nozzle. The light may generate plasma and a shockwave in fluid within the nozzle. The generated plasma and shockwave may be provided to the surface for removing the contaminant particles on the surface.

The term "coupled" is defined as connected, although not necessarily directly, and not necessarily mechanically.

The terms "a" and "an" are defined as one or more unless this disclosure explicitly requires otherwise.

The term "substantially," "about," and its variations are defined as being largely but not necessarily wholly what is specified as understood by one of ordinary skill in the art, and in one-non and in one non-limiting embodiment the substantially refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

Other features and associated advantages will become apparent with reference to the following detailed description of specific embodiments in connection with the accompanying drawings.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

FIG. 2 is a laser nozzle, in accordance with embodiments of this disclosure.

FIG. 3 is a plasma chamber cap for a laser nozzle, in accordance with embodiments of this disclosure.

FIGS. 4A and 4B show confinement of plasma by a magnetic field, in accordance with embodiments of this disclosure.

FIGS. 5A and 5B show an azimuthal magnetic field by use of torrid, in accordance with embodiments of this disclosure.

DESCRIPTION OF ILLUSTRATIVE EMBODIMENTS

The invention and the various features and advantageous details are explained more fully with reference to the nonlimiting embodiments that are illustrated in the accompanying drawings and detailed in the following description. Descriptions of well known starting materials, processing techniques, components and equipment are omitted so as not to unnecessarily obscure the invention in detail. It should be understood, however, that the detailed description and the specific examples, while indicating embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The present disclosure provides integrating different laser-based cleaning methods with a wet bench approach to control and/or substantially eliminate damage to a surface during a particle removal process. In one respect, shockwaves may be created in a fluid medium. In particular, the shockwaves may be created within a fluid dispensing nozzle which may be integrated into, for example, a wet cleaning tool.

Cleaning Tool

Figure 1A:
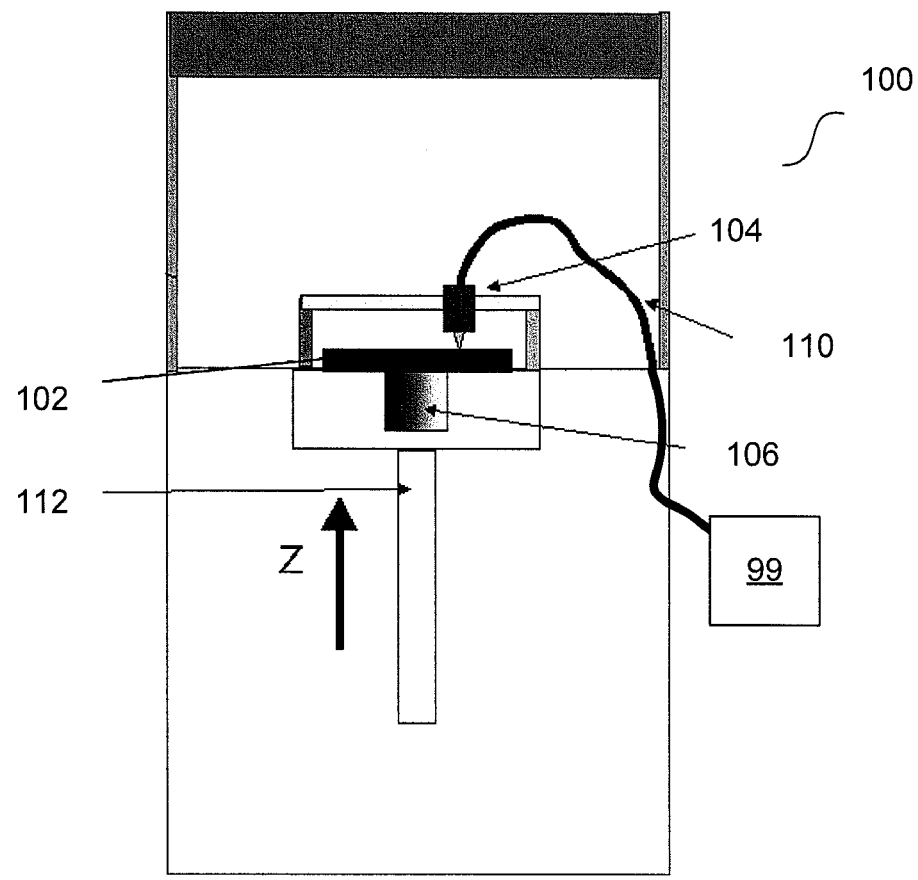
FIG. 1A is side-view of a cleaning tool, in accordance with embodiments of this disclosure.
Figure 1B:
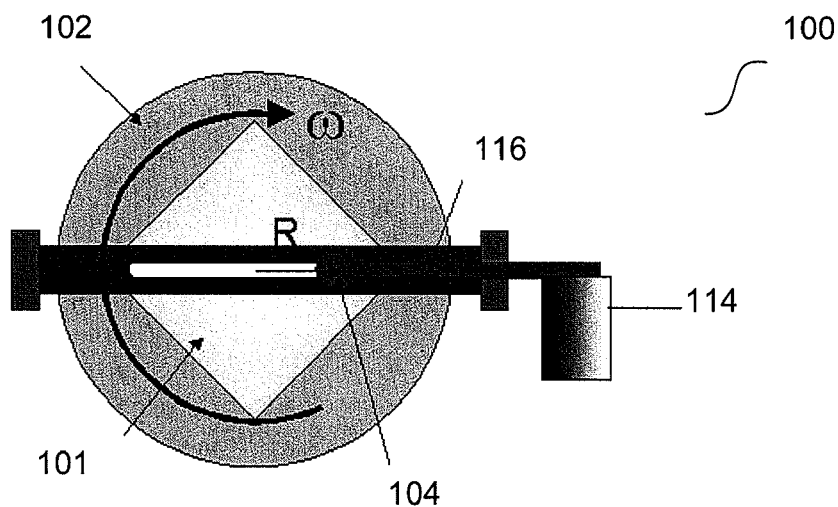
FIG. 1B is a top-view of the cleaning tool, in accordance with embodiments of this disclosure.

Referring to FIGS. 1A and 1B, a side-view and top-view of cleaning tool 100 according to embodiments of the disclosure are shown, respectively. Surface 101 may include contaminant particles such as, but not limited to, dust, organic materials, metal impurities, and the like. In some embodiments, surface 101 may be a substrate. Alternatively, surface 101 may be a plate, silicon wafers (patterned and unpatterned), glass wafers (patterned and unpatterned), glass substrates, photomask substrates, masks, or any other surfaces that include contaminant particles.

In some respect, surface 101 may be mounted on chuck 102 that may rotate around a z-axis via motor 106. Coupled to chuck 102 may be nozzle 104. In one respect, nozzle 104 may be mounted to an arm of chuck 102. Light source 99 may be coupled to nozzle 104 and may be focused on surface 101 to remove particles. Light source 99 may include, without limitation, high pressure mercury lamp (wavelength of about 250-450 nm), low pressure mercury lamp (wavelength of about 180-480 nm), UV light emitting and/or laser diode (wavelength of about 300-400 nm), metal halide lamp (wavelength of about 200-450 nm), Xe2 excimer lamp (wavelength of about 172 nm), Ar2 excimer lamp (wavelength of about 146 nm), KrCl excimer lamp (wavelength of about 222 nm), XeI excimer lamp (wavelength of about 254 nm), XeCl excimer lamp (wavelength of about 308 nm), ArF excimer laser (wavelength of about 193 nm), KrF excimer laser (wavelength of about 248 nm), F2 laser (wavelength of about 157 nm), or other suitable light sources known in the art.

In some respect, a window (not shown) at light source 99 may be heated by using a heater, a peltier device, or other heating elements (not shown) to prevent liquid condensation on the window or mirror surface.

In some embodiments, nozzle 104 may move on a radial axis and may allow for full scanning of the surface, using for example, nozzle motor 114. In addition to or alternatively, nozzle 104 may be coupled to nozzle arm 116 that may move nozzle 104 in, for example, a vertical and/or horizontal manner parallel to the surface. In addition to the scanning operation, nozzle arm 116 may be used for localized or targeted cleaning by moving the rotating the stage to an angle (θ) and nozzle to location (r). Hence, if the defect location is known, the nozzle may be moved to the specific location, and the cleaning process may be applied to that point, thus, limiting and/or substantially eliminating damage to the surface.

In one embodiment, cleaning tool 100 may be integrated in a dry cleaning tool for dry cleaning of a substrate. The application of a light source, such as, but not limited to a UV light source, may change the condition of most surfaces hydrophilic which results in a lower number of particles both in spin drying and surface-tension-gradient based drying processes.

Alternatively, cleaning tool 100 may be integrated into a wet cleaning tool (e.g., stripping tools, etching tools, etc.) and may be used for cleaning of a substrate in combination with a wet cleaning process.

Referring to FIG. 2, a closer view of nozzle 104 is shown. Nozzle 104 may include optical fiber 210 that may be coupled to collimator 216 via fiber coupler 214, and provides light from a light source 99 to surface 101. It is noted that optical fiber 210 may be coupled to collimator 216 via other coupling means, including, without limitation, direct coupling or via a SubMiniature version A (SMA) connector or other suitable connectors. Alternatively, optical fiber 210 may be embedded into nozzle arm 216, which may swivel, rotate, and/or slide over surface 101.

Nozzle 104 may also include lens element 218, coupled to collimator 216 that may be used for focusing the laser beam on the desired surface. In some embodiments, lens element 218 may include one lens. Alternatively, lens element 218 may include a plurality of lenses.

Cleaning tool 100 may be covered by a housing (e.g., polyvinylidene fluoride or other suitable housing) that may include a gap. A gas, such as, but not limited to, highly purified nitrogen may flow through this gap via gas feed 217 into a front portion of lens 218 to protect lens 218 from chemicals during the cleaning operation. In one embodiment, the gas may prevent condensation on lens element 218. Alternatively, the flow of some gas, such as substantially pure nitrogen, may also protect lens element 218 during the operation of the light source.

Nozzle 104 may include a light source operating in different modes. In one embodiment, the light source (e.g., light source 99) may include a laser which may operate in a direct laser cleaner mode in which the laser light may be focused on the defect on the surface and the defect may be removed by expansion. This may be done by rotating nozzle 104 over about the area of the defect and may allow a focused light onto a portion of the surface, such that the defects in the expose area may be removed. If the laser is focused on a few microns spot and if a particle is small (e.g., a few hundred nanometers), the damage area may be limited and/or substantially minute compared to conventional techniques. In another embodiment, if direct laser cleaning is used in combination with substrate scanning, the average energy applied to the surface may be lower and some degree of damage control is possible.

In another embodiment, nozzle 104 may allow the light source to remove particles in combination with a layer of liquid (e.g., water) provided onto surface 101. The light from the light source focused at the surface may evaporate the liquid and cause fast movement of liquid parallel to the surface. This parallel flow may remove the particles from the surface.

Alternatively, if the light source is a laser operating with wavelengths in the ultraviolet region, the photons may have enough energy to break the chemical bonds of the organic particles on the surface and may allow the particles to be easier to remove. In one embodiment, if oxygen is present in the environment, the UV light can produce ozone, as described in U.S. Ser. No. 11/301,643, entitled "A Method and Apparatus for an In-Situ Ultraviolet Cleaning Tool," filed on Dec. 13, 2005 and incorporated herein in its entirety. In turn, the produced ozone may react with the particles on the surface and subsequently remove them from the surface. Note that in this operation of the laser, a high intensity of laser causing ablation may not need to be used, but the high-energy photons may accelerate the desired chemical reactions by breaking unwanted chemical bonds.

If the wavelength of the laser is in the infrared or near-infrared region and the laser works in continuous operation mode or pulse operation mode with high pulse repetition rate, then the average energy transferred to the surface may be high enough to raise the temperature of the surface in the focal point of the laser light. The surface temperature may increase the chemical reactions to dissolve the particles.

In another embodiment, if chemicals, such as dilute hydrofluoric acid are used in combination with the focused light from the light source, the surface may be etched. In some embodiments, the etching may include an etch rate that depends on the temperature, which may rise at about or around the location of focused light. It is noted that different chemicals for different contaminant particles may be used, as most chemical reactions are temperature dependent.

In other embodiments, a light may be focused on a location above the surface such that if the laser's intensity is above the breakdown field of the environment, plasma and a shockwave may be created. Referring to FIGS. 3A and 3B, plasma chamber cap 320 may be coupled to the laser nozzle 304 via fixture coupling 328. Plasma cap 320 may include chamber 322 where plasma may be formed. The gas pressure in chamber 322 may be controlled by flow of the gas and conductance of inlet 324, outlet 326, chamber 322, pinhole 330, incoming laser aperture, and the gas flow, such as nitrogen flow. Further, the temperature of the chamber may be controlled by an electric heater or heat exchange liquid heater (not shown).

The light-induced (e.g., laser-induced) plasma created in chamber 322 may disappear shortly after the laser intensity is reduced. As such, in one embodiment, the plasma may be contained by using a magnetic field 430 applied to the plasma in the direction shown in FIG. 4A. The magnetic field lines may be created by moving charges in the plasma and confining these lines by applying magnetic field 432 substantially normal to the direction of the magnetic field 430, as shown in FIG. 4B. After the creation of the plasma, charges may expand radially from the center of the plasma outwards.

In one embodiment, a torrid for creating an azimuth magnetic field may be used to confine the plasma. In FIG. 5A, plasma 540 may be created at the focal point inside torrid 530 absent a magnetic field. Upon applying a magnetic field, plasma 540 may be confined in an upper part of torrid 530, as shown in FIG. 5B. In one embodiment, by adjusting the center of the magnetic field close enough to the focal point of the laser, plasma 540 may repel from the surface. Torrid 530 may have a dimension of few hundred microns, and thus, allows the whole assembly to be placed close to a surface (e.g., within about a few hundred microns). For example, in a typical laser shockwave setup, the focal point may be approximately 1.3 mm far from the surface.

Figure 6A:
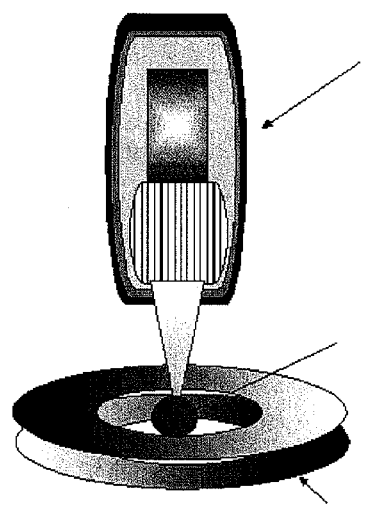
FIGS. 6A and 6B show an electric field for confining plasma in accordance with embodiments of this disclosure.
Figure 6B:
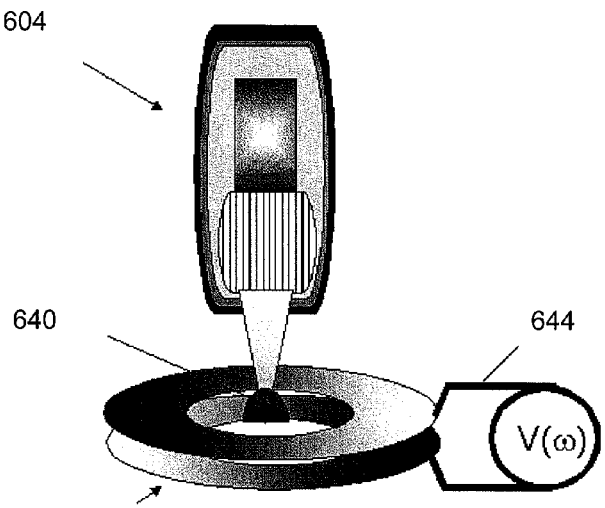

In other embodiments, plasma 640 may be confined by repelling the plasma within a two ring electrode configuration 642 when an electric field from electric power source 644 is applied, as shown in FIGS. 6A and 6B. In one embodiment, electric power source 644 may provide a DC voltage that may impact the charge density in the plasma. For example, by applying a proper voltage of about 100V, the plasma may be repelled from the surface, as shown in FIG. 6B. In an alternative embodiment, electric power source 644 may provide an AC field or radio frequency (RF) field that may be applied to electrodes 642.

In some embodiments, plasma confinement may be done in a horizontal configuration with the methods described above but changing the electrode configuration. For example in embodiments shown in FIGS. 6A and 6B, rectangular electrodes with a slit cut in the lower electrode may be used to allow the shockwave to propagate towards the surface of the plate, where the length of electrodes is more than the scanning distance of the light source. The light from the light source may enter horizontally between the two electrodes.

Alternatively, in other respects, a shockwave and plasma may be created within a running fluid flow dispensed by a nozzle, where a laser's intensity is above a breakdown field of the environment within a nozzle. For example, the laser intensity may be around or about 300 mJ/cm$^2$ or greater for creating shockwaves in a fluid such as DI water.

Liquids have higher molecular density than the gas, and therefore, the average shock wave energy transferred by a liquid to a surface is much more than the gas case. The liquid energy may also dissipate over a short distance due to high number of molecular collisions. This characteristic can be use to control potential damage to the surface by shockwave.

The fluid may be a liquid chemical (e.g., ammonia, acids, and the like), water, ozonated water, hydrogenated water, deionized water, mixtures of liquid chemical (e.g., ammonia hydroxide-hydrogen peroxide-water mixture, SC1, SC2, RCA-1, RCA-2, etc.), or other suitable fluids and may be dispensed onto a contaminated surface via a nozzle. Alternatively, the nozzle may dispense more than one fluid, which may subsequently be combined prior to reaching a surface. For the embodiment where more than one fluid is dispensed, the plasma may be created after the fluids are mixed. Therefore, the shock properties may depend on the mixture properties, including physical properties such as temperature, pressure, flow, and the like.

Figure 11:
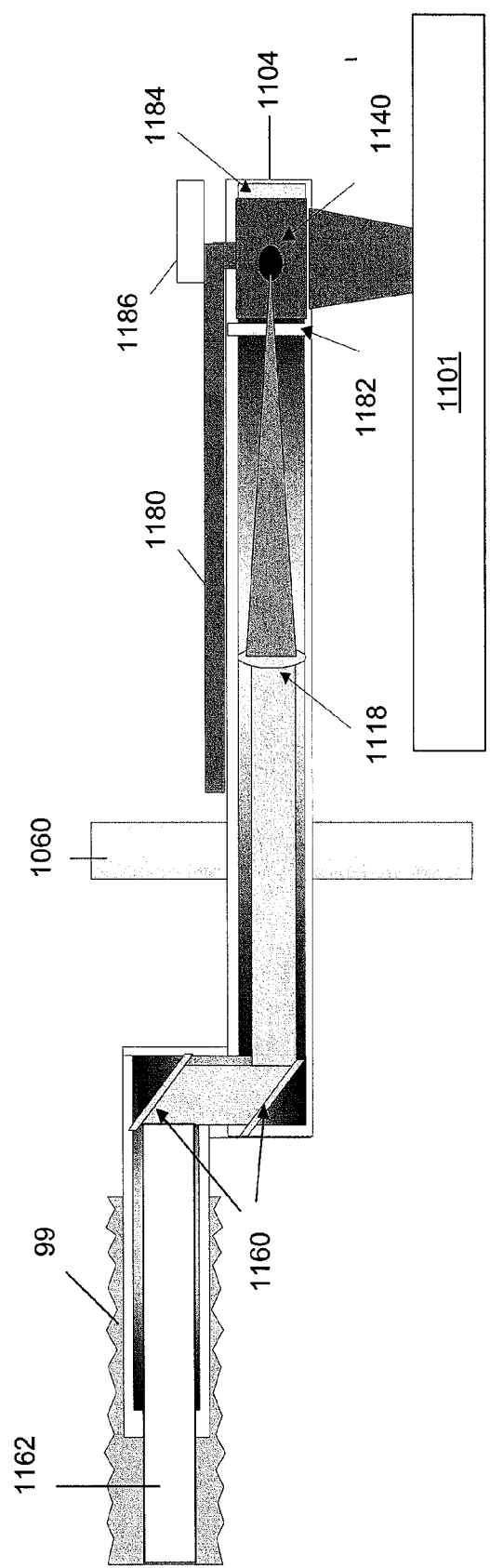
FIG. 11 is a laser-integrated cleaning system, in accordance with embodiments of this disclosure.

In one respect, plasma 1140 may be formed within a fluid and propagated inside a fluid flow. Referring to FIG. 11, light 1162 may be focused through nozzle 1104. In one respect, two parallel mirrors 1160 may be used to direct light 1162 from light source 99 into the nozzle 1104. Lens 1118 may be used to focus laser light 1162 through laser window 1182 to at least one fluid flow provided by, for example, fluid feed 1180 coupled to nozzle 1104. Once the plasma is created within the fluid flow, the plasma may be contained using, for example, the configurations shown in FIGS. 4-6, which may be coupled to nozzle 1104.

Additionally, a shockwave may be created (e.g., discharge or arch methods), where the generation or creation of the shockwave may depend on properties of the environment. For a fluid environment, the shockwave properties may depend on, for example, fluid flow, temperature, pressure, and/or density. In one respect, pressure sensor 1184, coupled to nozzle 1104 may be used to verify if a shockwave was generated in the fluid. In addition to or alternatively, pressure sensor 1184 may be used to control different flows from nozzle 1104 to surface 1101. In some respect, more than one pressure sensor may be used in combination with, for example, a motorized lens system (e.g., a motorized system including lens 1182) to adjust a focal point of a laser light (1162) with respect to the edges of a nozzle or to center the focal point to the center of the nozzle.

In a gas environment, creating a shockwave may depend on, among other things, the gas pressure, temperature, and composition. This shockwave may propagate through the media at a high velocity (approximately a few hundred meters per second or more) where the laser strikes the surface and may transfer high momentum to the particles on the surface to separate the particles from the surface. The surface damage may be controlled by limiting the intensity of the laser light and controlling the distance between the laser light and the surface.

In some embodiments, megasonic transducers or high speed flow may be used in combination with a shockwave nozzle. Referring again to FIG. 11, megasonic transducer 1186 may be coupled to nozzle 1104. The megasonic transducer may improve shockwave particle removal by reducing surface boundary layer and preventing of redeposition of particles removed by shockwave. The shockwaves may also reduce the surface boundary layer momentarily and causes more megasonic energy reach to particle at the surface and as a result, improve megasonic particle removal.

In some respects, liquid-assisted shock cleaning may be used. The application of a shockwave to a surface having a thin liquid film may evaporate the liquid film and cause fast movement of liquid substantially parallel to the surface. This substantially parallel flow may remove the particles from the surface.

Figure 7:
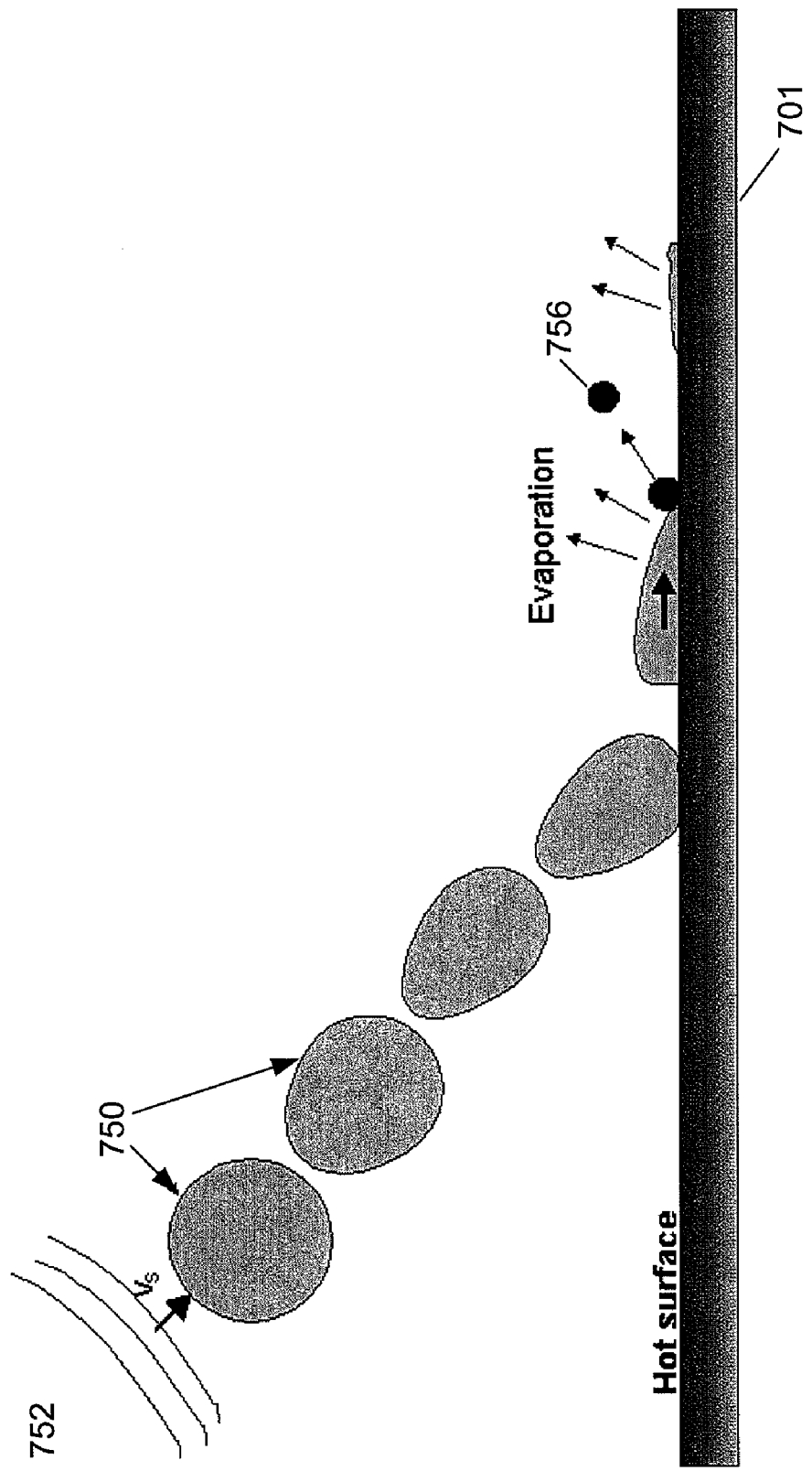
FIG. 7 shows a vapor/fume cleaning technique, in accordance with embodiments of this disclosure.

In one embodiment, a low-pressure vapor/fume may be created on top of the surface, as shown in FIG. 7. This low-pressure vapor/fume may include droplets 750 (e.g., microscale to nanoscale droplets) that may suspend above surface 701 such that when a shockwave is created, the shockwave may accelerate droplets 750 towards surface 701. In some respect, the speed of the droplet moving towards surface 701 may depend on the size of the droplets. In one embodiment, a shockwave may be created by discharge or arch methods. Other methods for creating shockwaves may also be applicable. When droplets 750 hit surface 701, particles 756 may be disturbed and subsequently removed.

In other embodiments, the temperature at surface 701 may be at a range of about 30° to 90° C. such that substantially little or no condensation occurs at the surface. As such, droplets 750 may decrease in volume as they approach surface 701 and subsequently be evaporated.

As noted above, optical fibers (e.g., 110, 210, and 310 of FIGS. 1, 2, and 3, respectively) may be used for coupling the laser light to the nozzle and also may be used for different laser cleaning mode. However, during the creation of the shockwave, the order of energy may be greater than 50 mJ/cm$^2$. Although the available fibers may handle average power up to 10 watts, spontaneous power consumption may be in the order of megawatts which may not be handled by normal optical fibers. As such, a direct coupling mechanism may be used for coupling the laser light to the nozzle. This design may rely on a one dimensional movement of a coupling arm, although the coupling arm may move in multiple dimensions as well.

Figure 8:
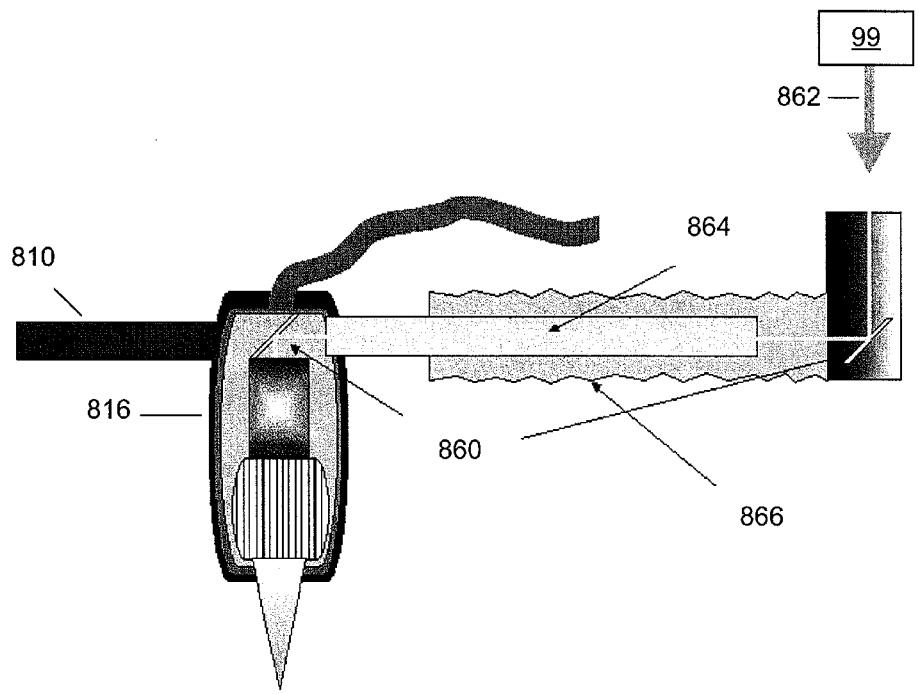
FIG. 8 is a laser nozzle coupled to a laser, in accordance with embodiments of this disclosure.

Referring to FIG. 8, an embodiment of the direct coupling is shown. Two parallel mirrors 860 may be used to direct light 862 from light source 99 into the nozzle. In one embodiment, one mirror of parallel mirrors 860 may be positioned on a top surface of collimator 816 at an angle of approximately about 45 degree with respect to the incoming light beam 862. Coupling arm 864, which directs incoming beam 862 to the mirror coupled to collimator 816, may be a hollow cylinder that may be fixed at one end to the nozzle and the other end may slide into the flexible arm. Coupling arm 864 may include protection sleeve 866 used to protect coupling arm 864 during the cleaning process and/or chemical exposure. Protection sleeve 866 may include, without limitation, a flexible jacket, bellow, or telescopic sleeve.

In some embodiments, collimator 816 may be coupled to nozzle arm 810 for moving the nozzle to a location on a surface that requires cleaning. As such, nozzle arm 810 may be coupled to the nozzle motor 114 as is shown in FIG. 1. Alternatively, nozzle arm 810 may be coupled to other mechanisms known in the art for rotating, sliding, and one- or multi-dimensional moving of the nozzle 804. Note that the arm movement may be in the direction of the beam and therefore, the laser beam may pass through the arm and get focused on the surface, independent of the nozzle location.

Figure 9:
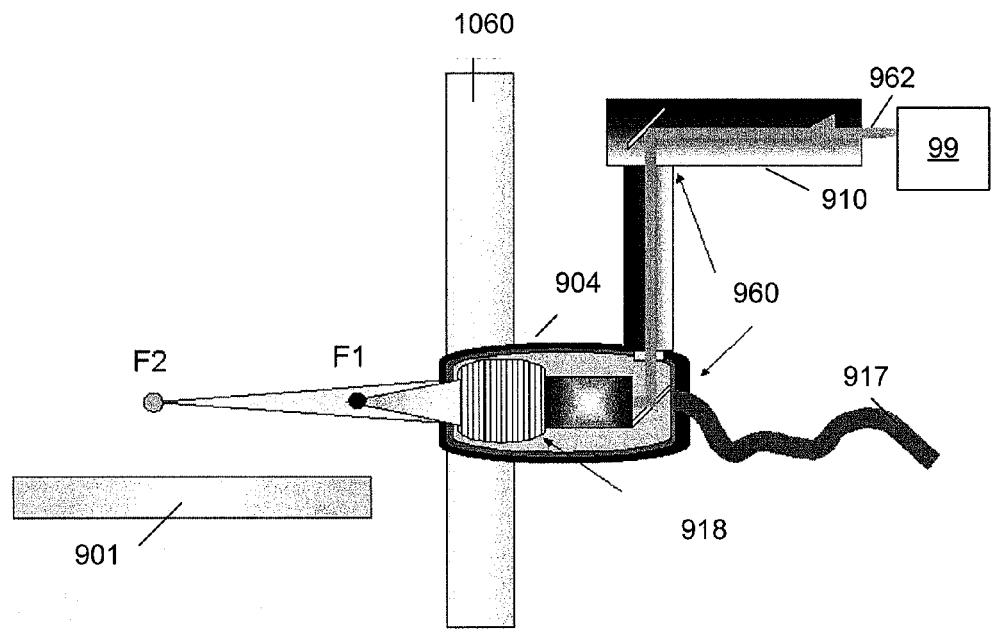
FIG. 9 is a horizontal configuration of the laser nozzle and laser of FIG. 8, in accordance with embodiments of this disclosure.

In a vertical configuration for the shock creation, if there is no plasma formation, the laser may directly hit the surface and may cause damage. Therefore, surface damage is one important issue in the vertical configuration in which the laser is normal to the plate surface. In order to avoid surface damage due to the direct exposure to surface from the laser beam, the laser light may be placed inside a cleaning tool substantially parallel to the surface of the plate. Referring to FIG. 9, incoming light 962 from light source 99 may be directed to surface 901 via nozzle arm 910 and a set of mirrors 960 spaced apart from each other. Nozzle 904 may remain fixed with respect to surface 104 to bowl wall 1060 of a cleaning tool and the focal points (F1 and F2) may be shifted by using a motorized zoom from lens 918, as shown in FIG. 9. The focal point may range to different areas of surface 101, allowing a light to be used for particle removal.

Figure 10:
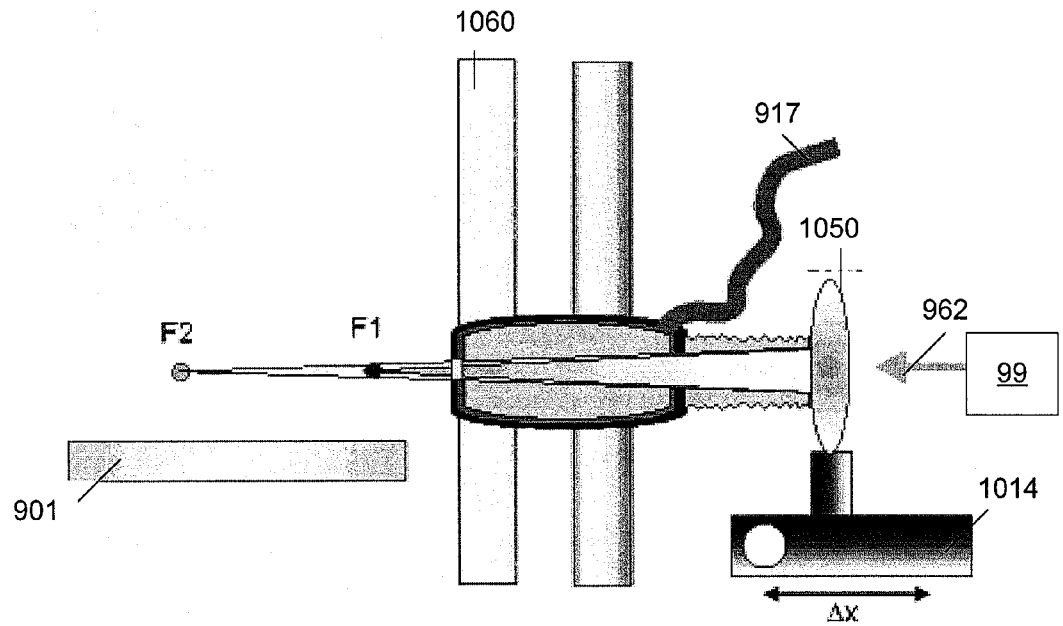
FIG. 10 is a laser coupled to long focal lens, in accordance with embodiments of this disclosure.

Alternatively, the focal point may be scanned by moving a lens out of the process chamber into the optical setup as shown in FIG. 10, where nozzle 1004 may remain fix to bowl wall 1060 relative to surface 901. Here, incoming light 1062 from light source 99 may be directed to a surface via moving lens 1050 coupled to a means for rotating the moving lens in a range of about Δx (e.g., a hydraulic system, a pneumatic system, a manual system that may be set up prior to the cleaning process, a chain operated machinery, air cylinders, ring and pinion gear, an electrical system, other motorized systems known in the art, or a combination of any of the above). Δx may be changed from one focal point to another focal point (e.g., F1 to F2, or F2 to F1) to cover the areas of surface 901. The means for rotating moving lens may include motor 1014. Alternatively, other means for rotating moving lens known in the art may be applicable. By rotating moving lens 1050, the focal points (e.g., F1 and F2) may change relative to surface 1001.

The present disclosure provides targeted cleaning of a surface (e.g., mask and/or wafer) where the surface may first by inspected by a defect inspection tool. Next, the hard or soft defects are determined and the cleaning techniques mentioned above are used to locally remove the particles by targeting specific location of the defect on the surface. In this approach hard defects are removed locally.

The techniques that described above may be used for defect removal of both mask and wafers and other surfaces of interests. Further the techniques may be integrated to cleaning tools. Further, the present disclosure offers designs and concepts that can lead to a standalone laser based cleaning tool or as an added module to an existing cleaning tool.

All of the apparatuses and methods disclosed and claimed herein can be made and executed without undue experimentation in light of the present disclosure. While the apparatus and methods of this invention have been described in terms of preferred embodiments, it will be apparent to those of ordinary skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

The invention claimed is:

1. An apparatus for removing contaminant particles from a surface, comprising:
   a nozzle operably moveable to a location adjacent to a surface;
   a fluid feed coupled to the nozzle for providing a fluid flow through the nozzle;
   a light source coupled to the nozzle for providing light from the light source, the light generating plasma and a shockwave within the fluid flow, where the generated plasma and shockwave are provided to the surface by the nozzle for removing contaminant particles from the surface; and
   a sensor coupled to the nozzle for detecting a shockwave within the nozzle to verify generation of the shockwave.

2. The apparatus of claim 1, the surface being selected from the group consisting of a substrate, a plate, a patterned silicon wafer, an unpatterned silicon wafer, a glass wafer, a glass substrate, a photomask substrate, and a mask.

3. The apparatus of claim 1, the light source creating a shockwave for producing droplets, the droplets removing the contaminant particles from the surface.

4. The apparatus of claim 1, the light source being selected from the group consisting of a high pressure mercury lamp, a low pressure mercury lamp, an ultraviolet light emitting diode, an ultraviolet laser diode, a metal halide lamp, a Xe2 excimer lamp, a KrCl excimer lamp, a XeI excimer lamp, a XeCl excimer lamp, an ArF excimer laser, a KrF excimer laser, an Ar2 excimer lamp, and a F2 laser.

5. The apparatus of claim 1, the fluid feed being configured to provide more than one fluid flow through the nozzle.

6. The apparatus of claim 1, further comprising a lens element coupled to the nozzle for focusing the light to the fluid flow.

7. The apparatus of claim 1, further comprising a megasonic transducer coupled to the nozzle.

8. The apparatus of claim 1, the sensor further configured to control the fluid flow through the nozzle.

9. The apparatus of claim 1 being integrated into a wet processing chamber.

10. The apparatus of claim 1, the sensor further configured to control the light.

11. The apparatus of claim 10, the sensor further configured to control an adjustment of a focal point of the light.

12. A method for removing particles from a surface comprising:
   providing a fluid through a nozzle;
   focusing light onto the fluid within the nozzle for generating plasma and a shockwave in the fluid within the nozzle;
   providing the generated plasma and shockwave to a surface, the plasma and shockwave removing contaminant particles from the surface; and
   detecting a shockwave within the nozzle to verify generation of the shockwave.

13. The method of claim 12, the step of providing a surface comprises providing a substrate, a plate, a patterned silicon wafer, an unpatterned silicon wafer, a glass wafer, a glass substrate, a photomask substrate, or a mask.

14. The method of claim 12, the step of providing a fluid comprises providing more than one fluid through the nozzle.

15. The method of claim 12, the step of providing a fluid comprises providing a liquid chemical, water, ozonated water, hydrogenated water, deionized water, or mixtures of liquid chemicals.

16. The method of claim 12, further comprising controlling the fluid flow through the nozzle.

17. The method of claim 12, further comprising controlling the light.

18. The method of claim 17, controlling the light further comprising controlling an adjustment of a focal point of the light from the light source.

* * * * *

UNITED STATES PATENT AND TRADEMARK OFFICE
CERTIFICATE OF CORRECTION

PATENT NO.      : 7,629,556 B2                                          Page 1 of 1
APPLICATION NO. : 11/532700
DATED           : December 8, 2009
INVENTOR(S)     : Abbas Rastegar It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 213 days.

Signed and Sealed this

Second Day of November, 2010

David J. Kappos
*Director of the United States Patent and Trademark Office*